(12) United States Patent
Oshima

(10) Patent No.: US 8,829,651 B2
(45) Date of Patent: Sep. 9, 2014

(54) NITRIDE-BASED SEMICONDUCTOR SUBSTRATE AND SEMICONDUCTOR DEVICE

(75) Inventor: Yuichi Oshima, Tsuchiura (JP)

(73) Assignee: Hitachi Metals, Ltd., Tokyo (JP)

( * ) Notice: Subject to any disclaimer, the term of this patent is extended or adjusted under 35 U.S.C. 154(b) by 985 days.

(21) Appl. No.: 11/397,931

(22) Filed: Apr. 5, 2006

(65) Prior Publication Data

US 2007/0128753 A1 Jun. 7, 2007

(30) Foreign Application Priority Data

Dec. 5, 2005 (JP) .................................. 2005-350749

(51) Int. Cl.
*H01L 29/20* (2006.01)
(52) U.S. Cl.
USPC ..... 257/615; 117/952; 257/613; 257/E33.025
(58) Field of Classification Search
CPC .................... H01L 21/02389; H01L 31/03044
USPC .................. 117/952; 257/E33.025, 613, 615
See application file for complete search history.

(56) References Cited

U.S. PATENT DOCUMENTS

| 6,348,096 | B1 | 2/2002 | Sunakawa et al. |
| 6,413,627 | B1 * | 7/2002 | Motoki et al. ................. 428/332 |
| 6,555,845 | B2 | 4/2003 | Sunakawa et al. |
| 6,596,079 | B1 * | 7/2003 | Vaudo et al. ..................... 117/97 |
| 2002/0066403 | A1 | 6/2002 | Sunakawa et al. |
| 2004/0072410 | A1 * | 4/2004 | Motoki et al. ................. 438/481 |
| 2005/0009310 | A1 * | 1/2005 | Vaudo et al. ................... 438/543 |
| 2005/0092234 | A1 * | 5/2005 | Motoki et al. ................... 117/91 |
| 2007/0096147 | A1 | 5/2007 | Oshima |

FOREIGN PATENT DOCUMENTS

| JP | 10-312971 | 11/1998 |
| JP | 2000-12900 | 1/2000 |
| JP | 2003-078084 | 3/2003 |

OTHER PUBLICATIONS

Motoki et al., "Growth and characterization of freestanding GaN substrates", Journal of Crystal Growth 237-239 (2002) pp. 912-921.*
Shuji Nakamura, et al., "Si-and Ge-Doped GaN Films Grown with GaN Buffer Layers", Jpn. J Appl. Phys. vol. 31 (1992), pp. 2883-2888.
D.I. Florescu, et al. "High Spatial Resloution Thermal Conductivity and Raman Spectroscopy lnyestigation of Hydride Vapor Phase Epitaxy drown n-GaN/sapphire (0001): Doping Dependence", Journal of Applied Physics, vol. 88, No. 6, Sep. 15, 2000, pp. 3295-3300.

(Continued)

*Primary Examiner* — Jay C Kim
(74) *Attorney, Agent, or Firm* — McGinn IP Law Group, PLLC

(57) ABSTRACT

A nitride-based semiconductor substrate has a diameter of 25 mm or more, a thickness of 250 micrometers or more, a n-type carrier concentration of $1.2 \times 10^{18}$ cm$^{-3}$ or more and $3 \times 10^{19}$ cm$^{-3}$ or less, and a thermal conductivity of 1.2 W/cmK or more and 3.5 W/cmK or less. Alternatively, the substrate has an electron mobility $\mu$ [cm2/Vs] of more than a value represented by $\log_e \mu = 17.7 - 0.288 \log_e n$ and less than a value represented by $\log_e \mu = 18.5 - 0.288 \log_e n$, where the substrate has a n-type carrier concentration n [cm$^{-3}$] that is $1.2 \times 10^{18}$ cm$^{-3}$ or more and $3 \times 10^{19}$ cm$^{-3}$ or less.

4 Claims, 14 Drawing Sheets

11 SAPPHIRE SUBSTRATE

12 GaN FILM

(56) References Cited

OTHER PUBLICATIONS

R.Y. Korotkov, et al., "Electrical Properties of Oxygen Doped GaN Grown by Metalorganic Vapor Phase Epitaxy", Materials Research Center and Department of Materials Science and Engineering, MRS Internet. J. Nitride Semicond. Res. pp. 5S1 W3.80 (2000).
European Search Report with English translation dated Oct. 11, 2007.
Oshima, Yuichi, et al. "Thermal and Electrical Properties of High-Quality Freestanding GaN Wafers with High Carrier Concentration" Japanese Journal of Applied Physics vol. 45 No. 10A pp. 7685-7687, Oct. 6, 2006.
Submission of Information on Publications dated Dec. 22, 2009 with English translation.
Journal of Applied Physics 98, 103509 (5005), pp. 103509-1 to 103509-4.
Submission of Information on Publications dated Feb. 12, 2010 with English translation.
Usui et al., Jpn. J. Appl. Phys. 36 (1997), pp. L899-L902.
Japanese Office Action dated Sep. 11, 2012 with an English translation.
Y. Ohshima, et al., "Preparation of Free stand GaN wafers by Hydride Vapor Phase Epitaxy with Void-Assisted Separation", The Japan Society of Applied Physics, Jan. 25, 2003, vol. 42, pp. L1-L-3.

* cited by examiner

51 SAPPHIRE SUBSTRATE

52 GaN FILM

53 STRIPE MASK

54 FACET-GROWN GaN

55 GaN THICK FILM

56 GaN SELF-STANDING SUBSTRATE

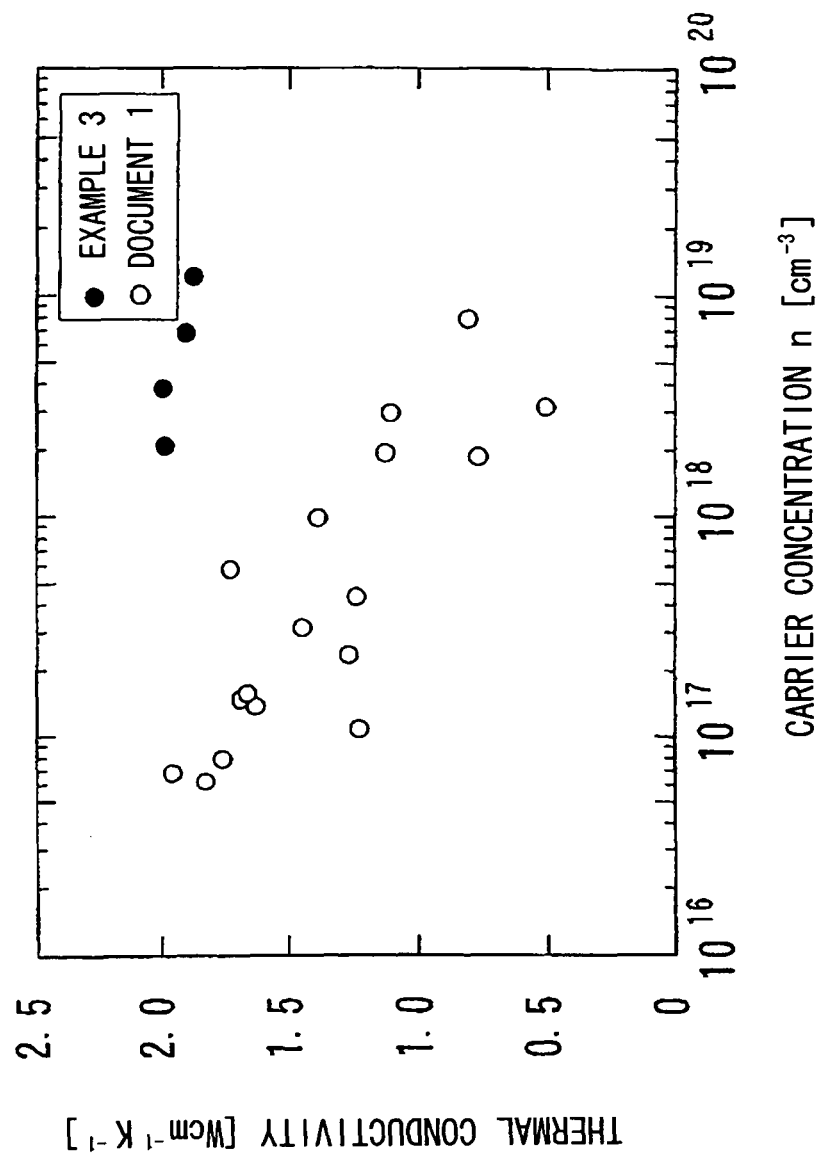

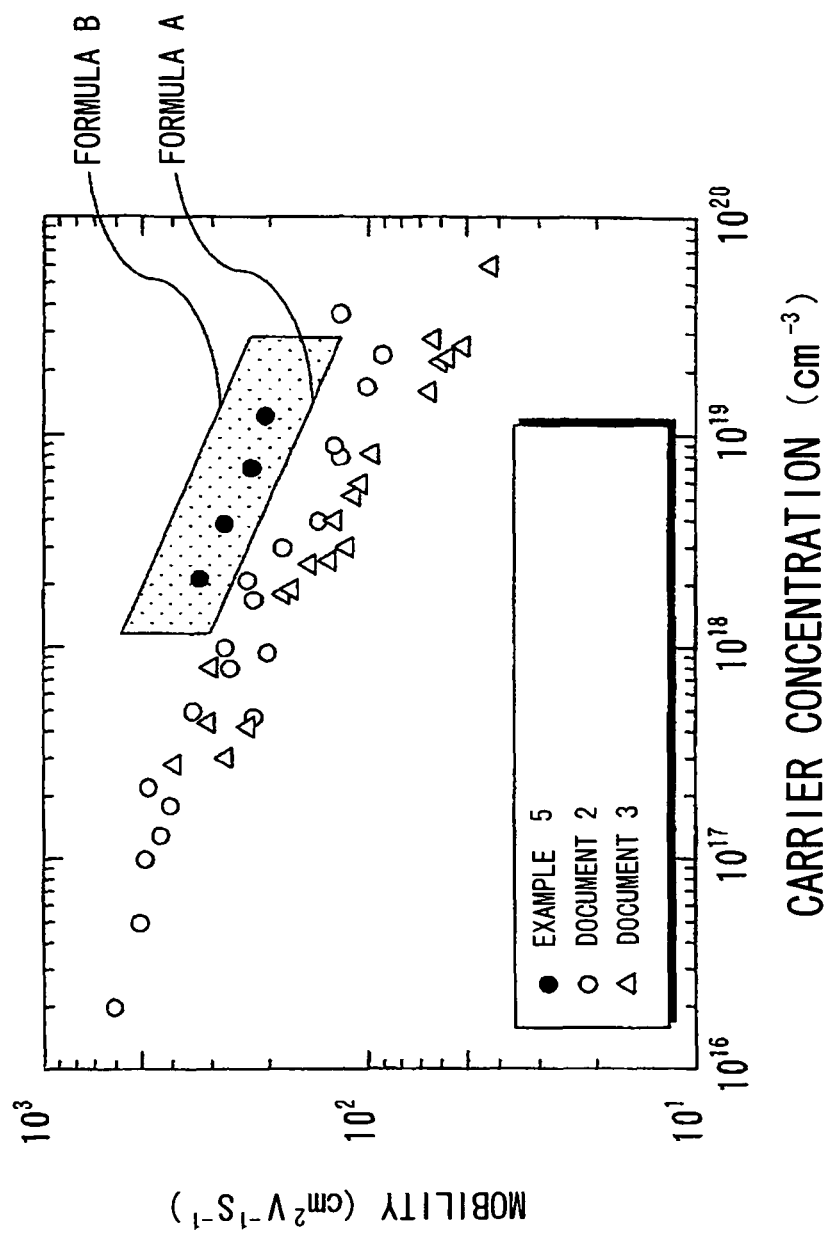

NITRIDE-BASED SEMICONDUCTOR SUBSTRATE AND SEMICONDUCTOR DEVICE

The present application is based on Japanese patent application No. 2005-350749, the entire contents of which are incorporated herein by reference.

BACKGROUND OF THE INVENTION

1. Field of the Invention

This invention relates to a nitride-based semiconductor substrate and, in particular, to a nitride-based semiconductor substrate that has a high thermal conductivity and electron mobility while securing a sufficient electrical conductivity. Also, this invention relates to a semiconductor device fabricated using the nitride-based semiconductor substrate.

2. Description of the Related Art

Nitride-based semiconductor devices attract attention for a high-output laser diode (LD) used in a high-speed writing next-generation DVD, for a high-output light emitting diode (LED) used in a automobile headlight or a general lighting system, and for a high power conversion element. In such devices, fast dissipation of heat to be generated in high-output operation is a key issue so as to provide a high output, high efficiency and high reliability device.

Thus far, the nitride-based semiconductor devices such as LED and LD have been fabricated generally by growing epitaxial layers on a sapphire substrate by MOVPE etc.

However, since the sapphire substrate has a thermal conductivity as low as 0.42 W/cmK, heat dissipation thereof is a serious problem. In this regard, when a SiC substrate is used instead of the sapphire substrate, the heat dissipation property can be enhanced significantly since it has a thermal conductivity of about 4 W/cmK. However, light extraction efficiency thereof is lowered since the conductive SiC substrate is thickly colored into green. In addition, dislocation density thereof is still as high as the sapphire substrate.

A method of improving the heat dissipation property of LED is a flip-chip mounting that the epi-layer side of a LED chip is mounted on a stem. However, when the sapphire substrate is used, a problem occurs that the amount of light incident to the sapphire substrate as a main light extracting portion does not increase as expected since there is a big refractive index difference between the epi-layer and the sapphire substrate. As a result, light extraction efficiency thereof is not enhanced so much. Furthermore, the fabrication cost must be increased since the process is complicated.

In case of using a GaN substrate, it is possible to provide a device with a good heat dissipation property due to its high thermal conductivity without reducing the light extraction efficiency.

A high-quality GaN is reported which has a thermal conductivity as high as about 2 W/cmK (See e.g., Document 1: D. I. Florescu et al., "High spatial resolution thermal conductivity and Raman spectroscopy investigation of hydride vapor phase epitaxy grown n-GaN/sapphire (0001): Doping dependence", Journal of Applied Physics 88(6) (2000) p 3295). This value is about five times the sapphire (0.42 W/cmK) and is a very high value close to aluminum (2.4 W/cmK).

In general, it is necessary to secure a sufficient electrical conductivity in order to reduce the operating voltage of a device or to form an ohmic contact on the surface of a GaN substrate. Therefore, doping of impurity is needed so as to have a carrier concentration of about $1.2 \times 10^{18}$ cm$^{-3}$ or more.

However, in general, the thermal conductivity of a semiconductor crystal lowers according to defect or impurity contained in the crystal. This is because phonon is dispersed by the defect or impurity or its complex. For example, Document 1 reports that the thermal conductivity of GaN is as high as 1.95 W/cmK at a carrier concentration (n) of $6.9 \times 10^{16}$ cm$^{-3}$, but it is reduced to about 0.5 W/cmK near at a carrier concentration (n) of $3.0 \times 10^{18}$ cm$^{-3}$. The latter thermal conductivity value is as low as the sapphire. Thus, the advantage of using the GaN substrate is spoiled.

In addition, since the impurity also causes the dispersion of carrier as described earlier, carrier mobility may be lowered thereby. When the carrier mobility is lowered, a high-density doping is needed to secure the same conductivity. This causes a vicious circle that the thermal conductivity lowers thereby. Thus, it is difficult to provide a GaN self-standing substrate with a high thermal conductivity and electron mobility when the carrier concentration is enhanced to secure a sufficient electrical conductivity.

SUMMARY OF THE INVENTION

It is an object of the invention to provide a nitride-based semiconductor substrate that has a high thermal conductivity and electron mobility while securing a sufficient electrical conductivity.

It is a further object of the invention to provide a semiconductor device using the nitride-based semiconductor substrate.

(1) According to one aspect of the invention, a nitride-based semiconductor substrate comprises:

a substrate comprising a nitride-based semiconductor, wherein the substrate comprises a diameter of 25 mm or more, a thickness of 250 micrometers or more, a n-type carrier concentration of $1.2 \times 10^{18}$ cm$^{-3}$ or more and $3 \times 10^{19}$ cm$^{-3}$ or less, and a thermal conductivity of 1.2 W/cmK or more and 3.5 W/cmK or less.

(2) According to another aspect of the invention, a nitride-based semiconductor substrate comprises:

a substrate comprising a nitride-based semiconductor, wherein the substrate comprises a diameter of 25 mm or more, a thickness of 250 micrometers or more, and an electron mobility $\mu$ [cm2/Vs] of more than a value represented by $\log_e \mu = 17.7 - 0.288 \log_e n$ and less than a value represented by $\log_e \mu = 18.5 - 0.288 \log_e n$, where the substrate comprises a n-type carrier concentration n [cm$^{-3}$] that is $1.2 \times 10^{18}$ cm$^{-3}$ or more and $3 \times 10^{19}$ cm$^{-3}$ or less.

(3) According to another aspect of the invention, a semiconductor device comprises:

the nitride-based semiconductor substrate as defined in (1) or (2); and a nitride-based semiconductor layer grown epitaxially on the nitride-based semiconductor substrate.

In the above inventions (1) to (3), the following modifications and changes can be made.

(i) The substrate comprises an electrical resistivity of 0.001 ohm·cm or more and 0.02 ohm·cm or less.

(ii) The substrate comprises a dislocation density of $1 \times 10^7$ cm$^{-2}$ or less.

(iii) The substrate comprises a concentration of As, O, Cl, P, Na, K, Li, Ca, Sn, Ti, Fe, Cr and Ni to be all $1 \times 10^{17}$ cm$^{-3}$ or less.

BRIEF DESCRIPTION OF THE DRAWINGS

The preferred embodiments according to the invention will be explained below referring to the drawings, wherein:

FIG. 7 is a graph showing a relationship between a carrier concentration and a thermal conductivity in Example 3 according to the invention;

FIG. 14 is a graph showing a relationship between a carrier concentration and an electron mobility in Example 5.

DETAILED DESCRIPTION OF THE PREFERRED EMBODIMENTS

Figure 1:
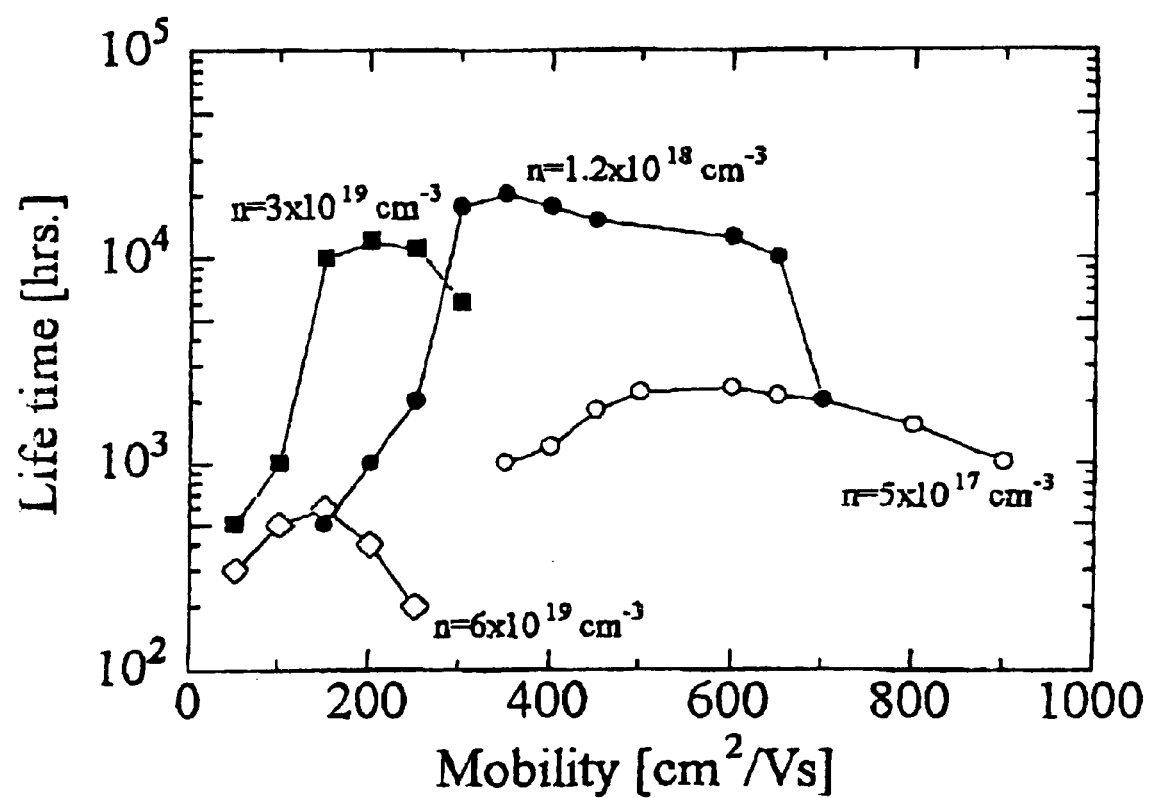
FIG. 1 is a graph showing a relationship between a stay time over Ga melt of HCl gas and carrier gas and an impurity concentration in grown crystal.

A GaN self-standing substrate and a method of making the same in preferred embodiments of the invention will be detailed below.

Size of Substrate

The GaN self-standing substrate of the embodiment has a diameter of 25 mm or more and a thickness of 250 μm or more. If less than 25 mm in diameter, the productivity of the substrate lowers. If less than 250 μm in thickness, the mechanical strength of the substrate lowers and, therefore, the substrate may be hard to handle.

Thermal Conductivity

The GaN self-standing substrate of the embodiment has a thermal conductivity of 1.2 W/cmK or more when its n-type carrier concentration is $1.2 \times 10^{18}$ cm$^{-3}$ or more.

In general, in order to secure an electrical conductivity of substrate, it is necessary to increase its carrier concentration by doping an impurity such as Si and Ge. However, due to the doping of the impurity, the thermal conductivity lowers. In this regard, the GaN self-standing substrate of the embodiment can succeed in reducing significantly the impurity level by a method as described later (e.g., the concentrations of As, O, Cl, P, Na, K, Li, Ca, Sn, Ti, Fe, Cr and Ni can be all reduced to $1 \times 10^{17}$ cm$^{-3}$ or less). Therefore, even when the carrier concentration is increased by doping to have a sufficient electrical conductivity (i.e., even when the n-type carrier concentration is $1.2 \times 10^{18}$ cm$^{-3}$ or more), the thermal conductivity can be 1.2 W/cmK or more, preferably 1.5 W/cmK or more, more preferably 2.0 W/cmK. The reason for setting the lower limit of the thermal conductivity to be 1.2 W/cmK is that the heat dissipation effect of the device is insufficient if less than 1.2 W/cmK.

On the other hand, the upper limit of the thermal conductivity is to be 3.5 W/cmK. This is because it is beyond a theoretical limit so that the crystal may have some abnormality if more than 3.5 W/cmK. For example, anisotropic thermal conduction in superlattice structure may be generated due to a periodical fluctuation in growth condition, whereby a large thermal conductivity may appear in a specific direction and only a small thermal conductivity may appear in a direction perpendicular to the specific direction. As a result, heat will be confined locally. Further, even the normal epitaxial growth may be not performed since the crystal structure is subjected to some abnormality.

Electron Mobility

The GaN self-standing substrate of the embodiment has an electron mobility, μ [cm$^2$/Vs], of more than a value represented by $\log_e \mu = 17.7 - 0.288 \log_e n$ and less than a value represented by $\log_e \mu = 18.5 - 0.288 \log_e n$, where the n-type carrier concentration n [cm$^{-3}$] is $1.2 \times 10^{18}$ cm$^{-3}$ or more and $3 \times 10^{19}$ cm$^{-3}$ or less. The lower limit of the electron mobility is determined in view of a balance between a doping amount needed to have a desired carrier concentration and a reduction in thermal conductivity caused thereby. The upper limit of the electron mobility is determined in view of avoiding the anisotropic thermal conduction due to the superlattice structure and a biased flow of current accompanied therewith, or the incidence of epitaxial growth abnormality due to the abnormal crystal structure as in the case of the thermal conductivity.

Carrier Concentration

The GaN self-standing substrate of the embodiment has a n-type carrier concentration n [cm$^{-3}$] of $1.2 \times 10^{18}$ cm$^{-3}$ or more and $3 \times 10^{19}$ cm$^{-3}$ or less. If less than $1.2 \times 10^{18}$ cm$^{-3}$, it is difficult to form the ohmic contact to the substrate so that the resistivity of the device cannot be reduced. If more than $3 \times 10^{19}$ cm$^{-3}$, the thermal conductivity lowers abruptly and the normal epitaxial growth may be not performed due to a large strain applied to the crystal.

The doped impurity (=dopant) can be Si, Ge, O, C etc. and a combination thereof.

Electrical Resistivity

The GaN self-standing substrate of the embodiment has preferably an electrical resistivity of 0.02 ohm·cm to secure the sufficient conductivity. When the doping amount is increased too much to reduce the electrical resistivity (or to increase the conductivity, the thermal conductivity may be affected badly or the crystalline quality may deteriorate. Therefore, the doping amount is preferably controlled so as to have a lower limit of 0.001 ohm·cm in electrical resistivity.

Method for Reducing the Impurity Concentration

It is important to reduce the impurity concentration in order to obtain the abovementioned GaN self-standing substrate with the high thermal conductivity. In general, in order to reduce the impurity concentration, it is needed to increase the purity of a raw material, carrier gas and a member used in the growth, or to install a glove box or to conduct a sufficient purge before the growth, or to make a complete control of furnace impurity level such as pre-baking.

However, a residual impurity incorporated in the grown crystal causes a reduction in thermal conductivity.

The inventor considers how to further reduce the impurity level to enhance the thermal conductivity. As a result, the inventor finds the following three effective methods (a) to (c)

(a) To Contact Source Gas or Carrier Gas with Ga Melt for a Long Time Period in the HVPE Method To increase the purity of the raw material is fundamental to enhancement of the purity of crystal. In the HVPE method, GaCl as a group III source is generated by flowing or bubbling HCl gas and carrier gas over or in the Ga melt disposed in the furnace to react them each other. The HCl gas has a very strong corrosive property and contains many kinds of impurities, e.g., metal elements. The Ga melt has a high impurity trapping effect. The inventor investigated the relationship between a time period to allow HCl gas to stay over (or contacted with) the Ga melt and a resultant impurity concentration in the grown crystal. As a result, it is found that the purity of the grown crystal can be significantly enhanced by setting the stay time period to be longer than a conventional time period.

FIG. 1 is a graph showing a relationship between the time period to allow HCl gas and carrier gas to stay over the Ga melt and the concentration of impurity trapped in grown crystal.

As a result, it is understood that, by setting the stay time over the Ga melt to be about 1 min. (=60 sec.) or more, the oxygen (O) impurity concentration can be significantly reduced to about $10^{16}$ cm$^{-3}$ from about $10^{18}$ cm$^{-3}$ and the iron (Fe) impurity concentration can be significantly reduced to about $10^{14}$ cm$^{-3}$ from about $10^{17}$ cm$^{-3}$. In general, the HCl gas is supplied into the reactor together with the carrier gas. Therefore, it is assumed that the carrier gas can be purified as well as the HCl gas by being contacted with the Ga melt with the high impurity trapping effect for 1 min. or more. However, it is impossible to purify $NH_3$ as a group V source as well since the $NH_3$ reacts strongly with Ga.

Although the stay time needed over the Ga melt may vary depending on other factors such as a shape of reservoir, the same tendency as shown in FIG. 1 can be obtained even when the other factors vary. Thus, the stay time is to be about 1 min. or more.

(b) To Form a Thin Film with Microscopic Pores to Have the Impurity Trapping Effect on an Underlying Substrate The inventor finds that the thin film with a number of microscopic pores made of a metal or metal compound is effective in preventing an impurity left even after conducting the above process (a).

For example, after a nitride-based semiconductor layer is grown on a sapphire substrate as the underlying substrate by MOVPE etc., a metal film made of titanium, nickel, tantalum, tungsten etc. is formed on the nitride-based semiconductor layer. Then, by conducting a heat treatment in an atmosphere containing hydrogen and ammonia, the metal is nitrided and aggregated to provide a structure (herein called nanomask) with a number of microscopic pores. The nanomask allows the relaxation of strain caused by lattice mismatch or a difference in thermal expansion coefficient between the sapphire substrate and the nitride-based semiconductor layer so as to reduce the defect density (e.g., up to a dislocation density of $1 \times 10^7$ cm$^{-2}$ or less). Especially when the metal film of titanium is formed thereon and nitrided in surface, the titanium nitride also serves as a buffer layer for the nitride-based semiconductor layer which is grown on the metal film. Therefore, the grown nitride-based semiconductor layer can have a good crystalline quality.

The metal film can be grown by the vapor deposition method, sputtering, various CVD methods etc. The microscopic pores are desirably dispersed uniformly on the surface of the metal film so as to reduce the defect density (e.g., up to a dislocation density of $1 \times 10^7$ cm$^{-2}$ or less) in the nitride-based semiconductor layer to be grown thereon. The production of the microscopic pores can be controlled by the thickness of the metal film, the thickness of the nitride-based semiconductor layer on the sapphire substrate, and the conditions of the heat treatment. For example, in order to allow the nitriding of the metal film and 100 nm or less of uniform microscopic pores, the heat treatment is desirably conducted at 700 degree Celsius or more and 1400 degree Celsius or less. If less than 700 degree Celsius, the nitriding is not sufficiently advanced and the uniform pores can be generated. If more than 1400 degree Celsius, the heat decomposition of the nitride-based semiconductor may be excessively advanced so that the nitride film is subjected to separation. The thickness of the metal film is desirably 1 micrometer or less. If more than 1 micrometer, the surface of the metal film may be formed uneven when the metal film is nitrided. This may cause an increase in defect in the nitride-based semiconductor layer to be grown thereon.

The heat treatment can be in a hydrogen gas atmosphere or a mixed gas atmosphere containing hydrogen. The mixed gas atmosphere containing hydrogen is, for example, a mixed gas atmosphere of 80 to 60% of hydrogen gas and 20 to 40% of ammonia.

Figure 2:
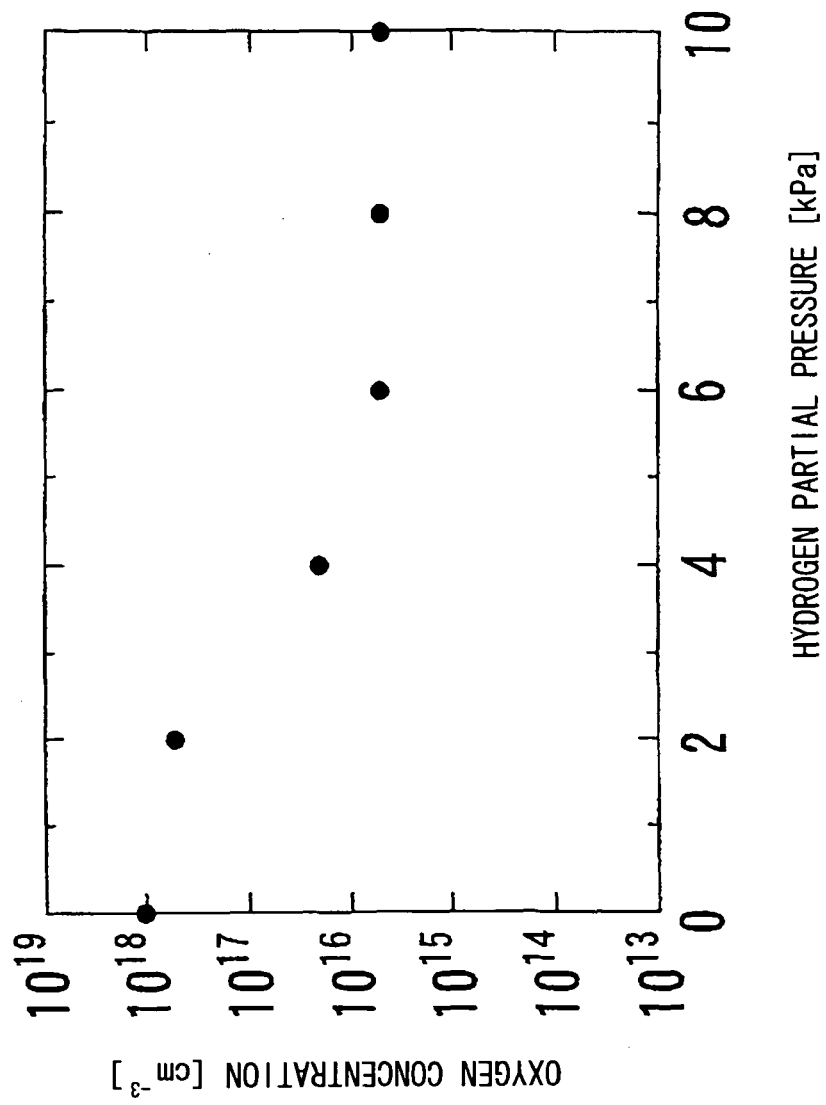
FIG. 2 is a graph showing a relationship between a hydrogen partial pressure in growing by HVPE a nitride-based semiconductor on an underlying substrate with a nano-mask formed thereon and an oxygen impurity concentration in the grown crystal.

FIG. 2 is a graph showing a relationship between a hydrogen partial pressure in growing by HVPE a nitride-based semiconductor on an underlying substrate with a nanomask formed thereon and an oxygen impurity concentration in the grown crystal.

As a result, it is understood that, by setting the hydrogen partial pressure to be 5 kPa or more, the oxygen (O) impurity concentration can be significantly reduced to about $10^{16}$ cm$^{-3}$ from about $10^{18}$ cm$^3$. This is assumed because the porous surface of the thin film is activated by hydrogen and, therefore, the impurity to impair the transparency of the crystal is likely to be trapped thereby. However, this effect can be obtained only before the surface of the substrate is covered with the grown crystal. Namely, after the porous thin film is completely covered with the grown crystal, the effect will be eliminated.

(c) To Shorten the Growth Period with a Facet (i.e., a Flat Crystal Plane) Other than c-Plane to be Likely to Trap the Impurity The growth of GaN is, in most cases, advanced on its initial stage according to a growth mode called Volmer-Waber type that a number of three-dimensional nuclei are generated and gradually combined each other to form a continuous film. During the growth, facets such as (1-102) are generated on the side of a growth nucleus and are left as a pit for a while even after the growth nuclei are combined each other.

The inventor finds that, in case of growing the crystal with the facets, the impurity, especially oxygen is likely to be trapped thereby as compared to the case of growing the crystal with the flat c-plane (i.e., substantially without any facets other than the c-plane). The oxygen thus trapped may be dispersed in the crystal to impair the transparency even after the growth surface is flattened. Thus, it is important to make a transition to the flat growth as soon as possible.

Figure 3:
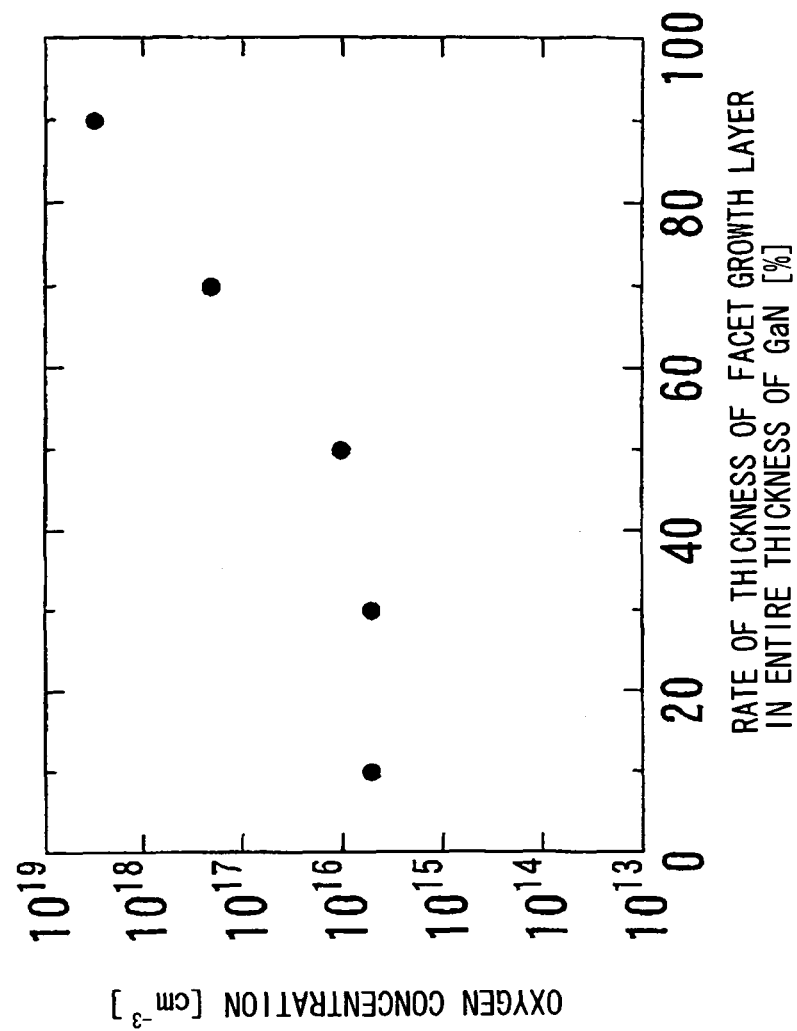
FIG. 3 is a graph showing a relationship between a rate of the thickness of a facet-grown layer in the entire thickness of a GaN layer and an oxygen concentration in the grown crystal.

FIG. 3 is a graph showing a relationship between a rate of the thickness of a facet-grown layer in the entire thickness of a GaN layer and an oxygen concentration in the grown crystal.

As a result, it is understood that the oxygen impurity concentration can be effectively reduced to a low range of $10^{16}$ cm$^{-3}$ or less by controlling the thickness of the facet-grown layer in the entire thickness to be about 30% or less.

The method (c) is effective in reducing the impurity after the surface of the substrate is completely covered with the grown crystal.

The methods (a) to (c) may be conducted individually or in a combination of any thereof.

Effects of the Embodiment

As described above, in the growth of GaN, by using any one or all of:

(a) the impurity trapping effect by the Ga melt;
(b) the impurity trapping effect by the porous film; and
(c) the early transition to growing with the plane less likely to trap the impurity,
a nitride-based semiconductor substrate can be fabricated with:

(1) a high thermal conductivity of 1.2 W/cmK or more and 3.5 W/cmK or less, where the n-type carrier concentration is $1.2 \times 10^{18}$ cm$^{-3}$ or more and $3 \times 10^{19}$ cm$^{-3}$ or less;

(2) a high electron mobility, $\mu$ [cm$^2$/Vs], of more than a value represented by $\log_e \mu = 17.7 - 0.288 \log_e n$ and less than a value represented by $\log_e \mu = 18.5 - 0.288 \log_e n$, where the n-type carrier concentration n [cm$^{-3}$] is $1.2 \times 10^{18}$ cm$^{-3}$ or more and $3 \times 10^{19}$ cm$^{-3}$ or less;

(3) a sufficiently low conductivity that a substrate electrical resistivity is 0.001 ohm·cm or more and 0.02 ohm·cm or less;

(4) a high crystalline quality that the dislocation density of the substrate is $1 \times 10^7$ cm$^{-2}$ or less;

(5) a low impurity concentration that the concentrations of As, O, Cl, P, Na, K, Li, Ca, Sn, Ti, Fe, Cr and Ni are all $1 \times 10^{17}$ cm$^{-3}$ or less.

Thus, since the thermal conductivity is kept high while securing the practically sufficient electrical conductivity (carrier concentration), the excessive heat can be fast dissipated as well as reducing the operating voltage of the high-output device. Further, since the carrier mobility is high, the sufficient electrical conductivity can be secured even when doping at a lower concentration than the conventional method. Therefore, the thermal conductivity can be enhanced.

Furthermore, by fabricating a nitride-based semiconductor on the nitride-based semiconductor substrate thus made, a nitride-based semiconductor device such as LED and LD operated in large current can be produced. Thus, the device can have a significantly enhanced operating efficiency and lifetime.

Example 1

An Example to Use the Method (a)

Figure 4:
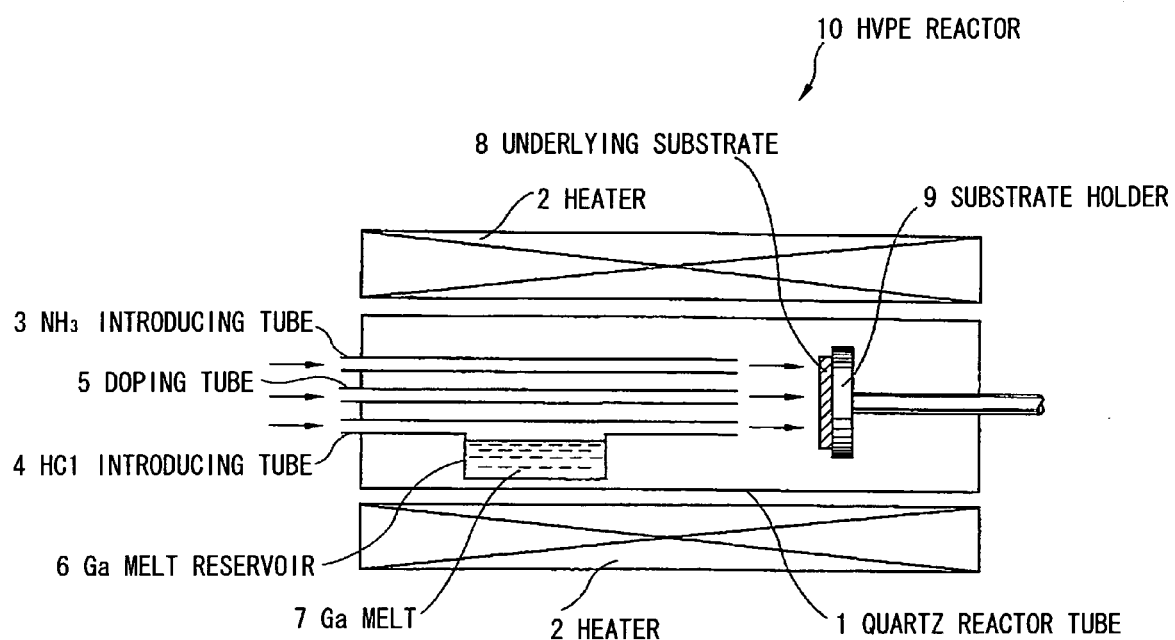
FIG. 4 is a schematic diagram illustrating an HVPE reactor used in Example 1 according to the invention.

FIG. 4 is a schematic diagram illustrating an HVPE reactor used in Example 1 according to the invention.

The HVPE reactor 10, which is a hot-wall type with a heater 2 outside a horizontally long quartz reactor tube 1, comprises, on the left side (i.e., upstream side) of the quartz reactor tube 1, an NH$_3$ introducing tube 3 to introduce NH$_3$ gas, a group V source, an HCl introducing tube 4 to introduce HCl gas for forming GaCl, a group III source, and a doping tube 5 to introduce doping gas for controlling the conductivity.

The HCl introducing tube 4 is halfway enlarged in its inside diameter to provide a Ga melt reservoir 6 to contain a Ga melt 7.

A substrate holder 9 with an underlying substrate 8 placed thereon is rotatably and movably disposed on the right side (i.e., downstream side) of the quartz reactor tube 1.

In growing GaN by using the HVPE reactor 10, the NH$_3$ gas as the group V source is introduced through the NH$_3$ introducing tube 3, the HCl gas to form the group III source through the HCl introducing tube 4, and a dopant element-containing gas through the doping tube 5. Meanwhile, the source gas, HCl gas and NH$_3$ gas are introduced mixed with a carrier gas such as H$_2$ gas to control the reactivity.

In the HCl introducing tube 4, the HCl gas is halfway contacted with the Ga melt 7 and thereby a reaction: Ga+HCl→GaCl+(½)H$_2$ is developed to produce gallium chloride, GaCl.

In this process, the stay time of the HCl gas over the Ga melt 7 is adjusted to be 1 min. or more by controlling the flow rate of H2 carrier gas based on a calculation in view of a volume of the Ga melt reservoir 6. Thereby, the HCl gas and carrier gas can be purified.

The mixed gas of purified GaCl gas and H$_2$ carrier gas, and the mixed gas of NH$_3$ and H$_2$ carrier gas are conveyed to a direction as shown by arrows in FIG. 4 in the space of the quartz reactor tube 1. Then, a reaction: GaCl+NH$_3$→GaN+HCl+H$_2$ is developed on the underlying substrate 8 placed on the substrate holder 9 to deposit GaN on the underlying substrate 8. In the HVPE method, the GaN single crystal is epitaxially grown at an atmosphere temperature of about 800 to 1050 degree Celsius. Waste gas is removed through a waste gas outlet (not shown).

The GaN single crystal thus grown can have a low impurity concentration since it is produced using the HCl source gas and H$_2$ carrier gas to be purified by being contacted with the Ga melt with the high impurity trapping effect for 1 min. or more.

Example 2

An Example to Use the Methods (a)+(b)+(c)

FIGS. 5A to 5G are cross sectional views showing a method of making a GaN self-standing substrate in Example 2 according to the invention.

A GaN self-standing substrate is made by a process as shown in FIGS. 5A to 5G.

Figure 5A:
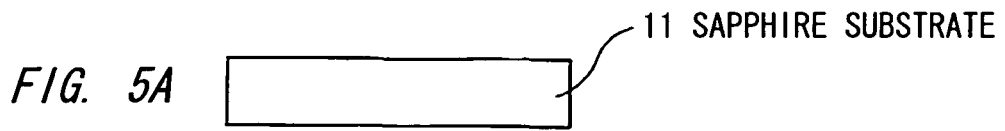
FIGS. 5A to 5G are cross sectional views showing a method of making a GaN self-standing substrate in Example 2 according to the invention.
Figure 5B:
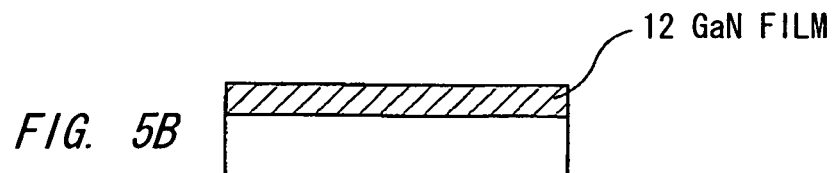
Figure 5C:
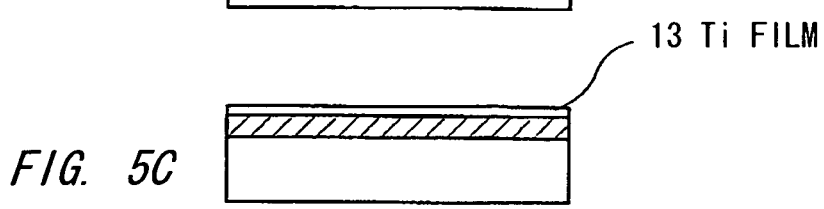
Figure 5D:
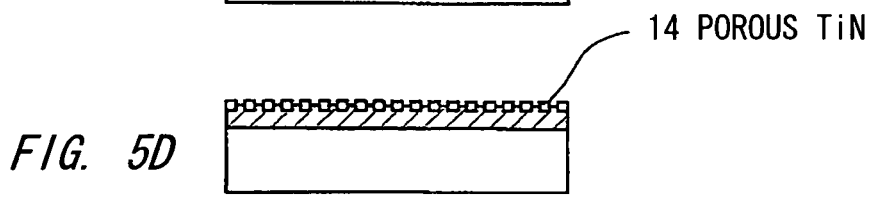
Figure 5E:
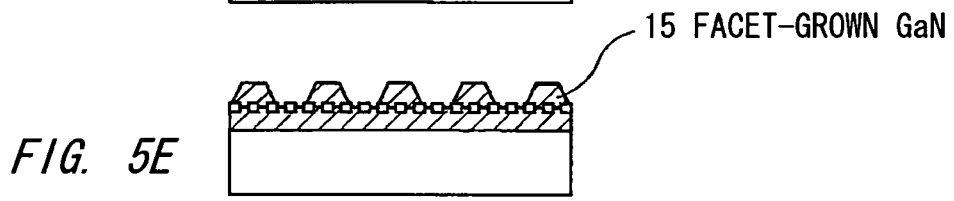

First, a sapphire substrate 11 with a diameter of 2 inches is provided as an underlying substrate (FIG. 5A). Then, a GaN film 12 is formed 300 nm thick on the sapphire substrate 11 by MOVPE (FIG. 5B). Then, a Ti film 13 is vacuum-deposited 20 nm thick (FIG. 5C) thereon, and then heated at 1000 degree Celsius for 30 min. in a mixed atmosphere of H$_2$ and NH$_3$ (with H$_2$ gas partial pressure of 80 kPa). By the heat treatment, the Ti film 13 on the surface of the substrate is nitrided such that it is changed into a porous TiN 14 with a number of microscopic pores with an inside diameter of tens of nanometers by the aggregation effect (FIG. 5D).

Then, it is placed in the HVPE reactor 10 as shown in FIG. 4 and a GaN thick film 17 is grown 500 micrometers thick therein. In this process, the stay time of the HCl gas is adjusted to be 90 sec. by controlling the flow rate of H$_2$ carrier gas based on a calculation in view of the volume of the Ga melt reservoir 6. The H$_2$ partial pressure is 10 kPa, the GaCl partial pressure 2 kPa, and the NH$_3$ partial pressure 20 kPa. SiH$_2$Cl$_2$ is introduced through the doping tube 5 to adjust the final Si concentration to $5 \times 10^{18}$ cm$^{-3}$ to secure a sufficient conductivity.

In the crystal growth process, a facet-grown GaN 15 is grown on the initial stage (FIG. 5E) and then is combined each other to form a continuous film. As the result of observing the section of a crystal grown under the same conditions by a fluorescence microscope, the facet-grown GaN 15 has a thickness of about 75 micrometers. Thus, the rate of the thickness of the facet-grown GaN 15 in the entire thickness of the GaN layer is about 15%.

Figure 5F:
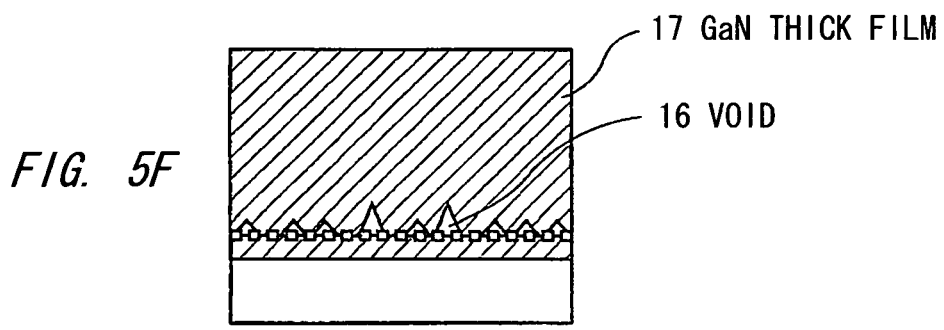
Figure 5G:
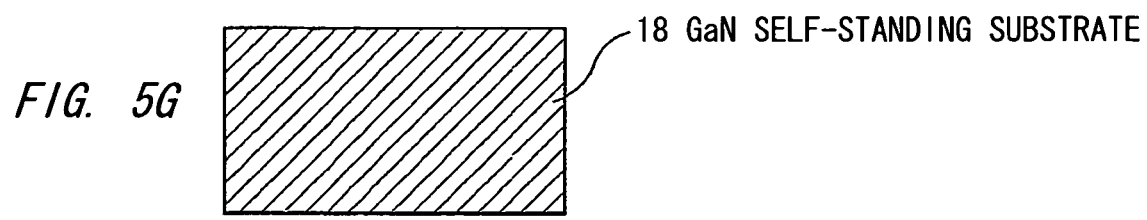

A number of voids are formed on the interface of the porous film in the process of the HVPE growth (FIG. 5F). Therefore, the GaN thick film 17 is by itself separated from the sapphire substrate 11 after the growth, whereby the GaN self-standing substrate 18 with a diameter of 2 inches is obtained (FIG. 5G).

The dislocation density of the obtained GaN self-standing substrate measured by the cathode luminescence method is a relatively good value, $3\times10^6$ cm$^{-2}$. The electrical resistivity thereof is a sufficiently low value, $4\times10^{-3}$ ohm·cm. O and Fe are not detected by SIMS analysis. Further, it is confirmed by the laser flash method that the thermal conductivity is as high as 2.0 W/cmK.

Comparative Example 1

FIGS. 6A to 6F are cross sectional views showing a method of making a GaN self-standing substrate in Comparative Example 1.

A GaN self-standing substrate is made by a process as shown in FIGS. 6A to 6F.

Figure 6A:
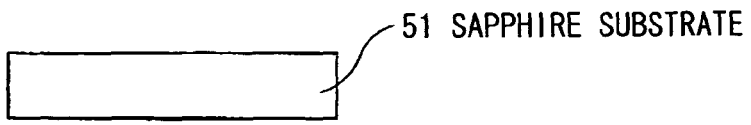
FIGS. 6A to 6F are cross sectional views showing a method of making a GaN self-standing substrate in Comparative Example 1.
Figure 6B:
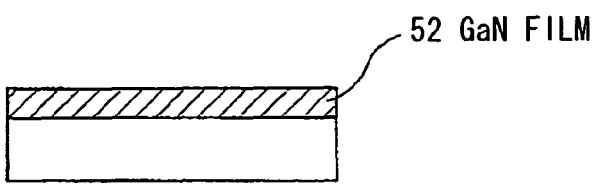
Figure 6C:
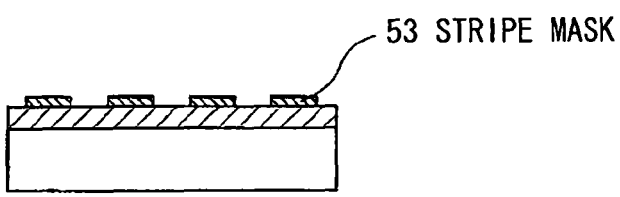
Figure 6D:
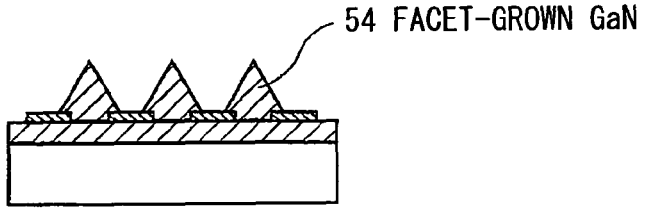

First, a sapphire substrate 51 with a diameter of 2 inches is provided as an underlying substrate (FIG. 6A). Then, a GaN film 52 is formed 300 nm thick on the sapphire substrate 51 by MOVPE (FIG. 6B). Then, a stripe mask 53 of SiO$_2$ is formed thereon by photolithography (FIG. 6C). The mask width and the opening width are 15 micrometers and 10 micrometers, respectively.

Then, it is placed in the HVPE reactor 10 as shown in FIG. 4 and a GaN thick film 55 is grown 500 micrometers thick therein. In this process, the stay time of the HCl gas is adjusted to be 20 sec. by controlling the flow rate of H$_2$ carrier gas based on a calculation in view of the volume of the Ga melt reservoir 6. The H$_2$ partial pressure is 3 kPa, the GaCl partial pressure 0.5 kPa, and the NH$_3$ partial pressure 20 kPa. SiH$_2$Cl$_2$ is introduced through the doping tube 5 to adjust the final Si concentration to $5\times10^{18}$ cm$^{-3}$ to secure a sufficient conductivity.

Figure 6E:
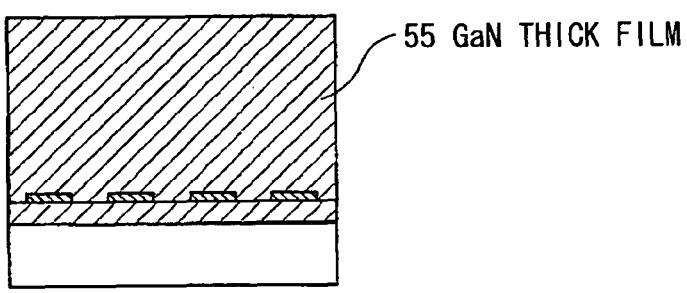

The crystal growth starts from the opening of the stripe mask 53, a facet-grown GaN 54 is then laterally grown (FIG. 6D), and a GaN thick film 55 is obtained with a flat surface (FIG. 6E). As the result of observing the section of a crystal grown under the same conditions by a fluorescence microscope, the facet-grown GaN 54 has a thickness of about 200 micrometers. Thus, the rate of the thickness of the facet-grown GaN 54 in the entire thickness of the GaN layer is about 40%.

Figure 6F:
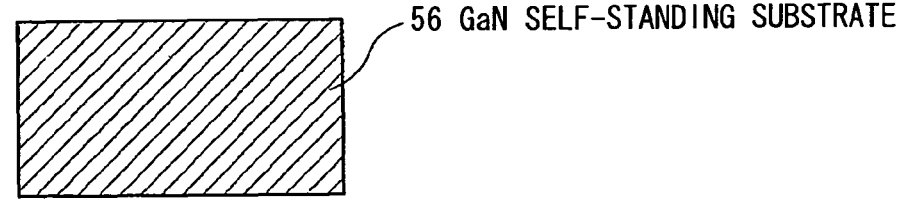

After the growth, the GaN thick film is separated from the sapphire substrate 51 by laser separation, whereby the GaN self-standing substrate 56 with a diameter of 2 inches is obtained (FIG. 6F).

The dislocation density of the obtained GaN self-standing substrate measured by the cathode luminescence method is a relatively good value, $8\times10^6$ cm$^{-1}$. The electrical resistivity thereof is a sufficiently low value, $4\times10^{-3}$ ohm·cm. However, by SIMS analysis, O is detected as high as $1\times10^{18}$ cm$^{-2}$ and Fe is detected about $3\times10^{17}$ cm$^{-2}$. Further, it is confirmed by the laser flash method that the thermal conductivity is as low as 0.8 W/cmK.

Experiments

The GaN self-standing substrates obtained in Example 2 and Comparative Example 1 are used to fabricate LED's with a same structure.

Both of them have the same optical output in 20 mA current feeding. However, in comparison of the optical output in 200 mA current feeding, it is found that the LED fabricated on the GaN self-standing substrate obtained in Example 2 is about 30% greater than that in Comparative Example 1. This is assumed because the GaN self-standing substrate in Example 2 has a thermal conductivity higher than that in Comparative Example 1 and, therefore, the excessive heat generated from the active layer can be efficiently dissipated from the LED.

Example 3

(Relationship Between Carrier Concentration and Thermal Conductivity)

The GaN substrate is produced in the same manner as Example 2 to have a carrier concentration in the range of $1\times10^{18}$ to $1.5\times10^{19}$ cm$^{-3}$.

FIG. 7 is a graph showing a relationship between a carrier concentration and a thermal conductivity in Example 3 according to the invention. For comparison, the experiment results of Document 1 are shown therein.

As shown in FIG. 7, the thermal conductivity changes little in Example 3 even when the carrier concentration is increased. In contrast, the thermal conductivity decreases significantly in Document 1 as the carrier concentration is increased. At a practical carrier concentration, the thermal conductivity is reduced to half or less that at a low carrier concentration.

Comparative Example 2

LED Using a Sapphire Substrate

Figure 8:
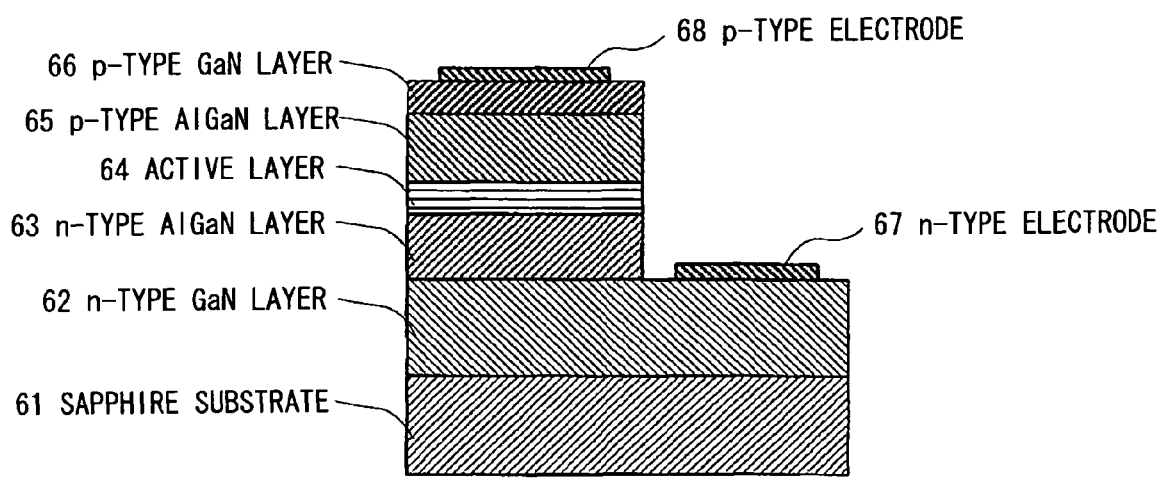
FIG. 8 is a schematic cross sectional view showing an LED structure in Comparative Example 2.

FIG. 8 is a schematic cross sectional view showing an LED structure in Comparative Example 2. The LED in Comparative Example 2 is produced as below.

First, on a c-plane sapphire substrate 61 with a diameter of 2 inches, a 4 micrometer-thick n-type GaN layer 62, a 40 nm-thick n-type Al$_{0.1}$Ga$_{0.9}$N layer 63, an In$_{0.15}$Ga$_{0.85}$N/GaN-3-MQW active layer 64 (well layer: 3 nm, barrier layer: 10 nm), a 40 nm p-type Al$_{0.1}$Ga$_{0.9}$N layer 65, and a 500 nm-thick p-type GaN layer 66 are sequentially grown epitaxially by MOCVD. This epi-wafer is cut into 300 micrometers square, and a p-type electrode 68 and an n-type electrode 67 are formed on the top surface thereof and a surface of the n-type GaN layer 62 exposed partially by dry etching.

The sapphire substrate-side of the chip is bonded through an Ag paste to a stem, and then an LED lamp is completed by wire bonding and resin sealing. The resultant LED lamp has a relatively low operating voltage of 4.2 V in 20 mA current feeding.

Figure 12:
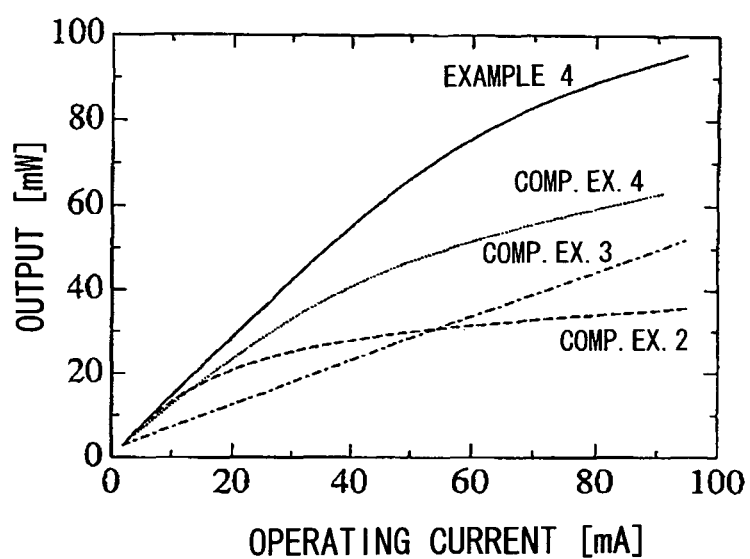
FIG. 12 is a graph showing an operating current dependency of optical output in the LED's of Example 4, Comparative Examples 2-4.

FIG. 12 shows current-output characteristics of Comparative Example 2 (=COMP. EX. 2 in FIG. 12). The output increases in a low current region up to about 20 mA as current increases. However, the output is almost saturated in a current region higher than 20 mA, and the maximum output is about 35 mW.

Figure 13:
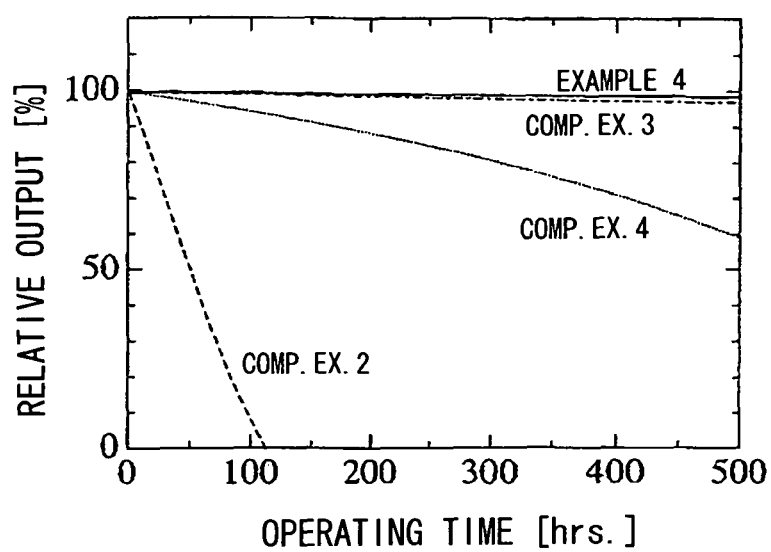
FIG. 13 is a graph showing an operating time dependency of relative output in the LED's of Example 4, Comparative Examples 2-4.

FIG. 13 shows a time dependency of relative output in 100 mA current feeding of Comparative Example 2 (=COMP. EX. 2 in FIG. 13), provided that output at the start of the current feeding is 100%. The output decreases abruptly as time passes, and the lamp emits little light when reaching about 100 hours or less. This is assumed because heat generated from the active layer cannot be sufficiently dissipated due to the low thermal conductivity of the sapphire substrate.

Comparative Example 3

LED Using a Conductive SiC Substrate

Figure 9:
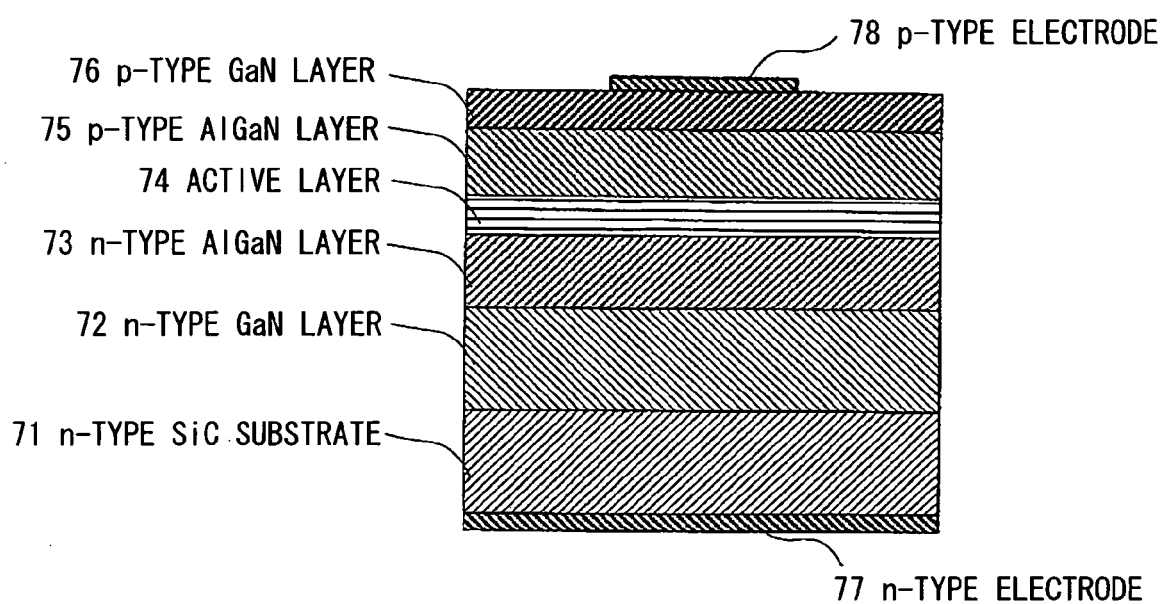
FIG. 9 is a schematic cross sectional view showing an LED structure in Comparative Example 3.

FIG. 9 is a schematic cross sectional view showing an LED structure in Comparative Example 3. The LED in Comparative Example 3 is produced as below.

First, on an n-type SiC substrate 71 with a diameter of 2 inches, a 4 micrometer-thick n-type GaN layer 72, a 40 nm-thick n-type $Al_{0.1}Ga_{0.9}N$ layer 73, an $In_{0.15}Ga_{0.85}N$/GaN-3-MQW active layer 74 (well layer: 3 nm, barrier layer: 10 nm), a 40 nm p-type $Al_{0.1}Ga_{0.9}N$ layer 75, and a 500 nm-thick p-type GaN layer 76 are sequentially grown epitaxially by MOCVD. This epi-wafer is cut into 300 micrometers square, and a p-type electrode 78 and an n-type electrode 77 are formed on both surfaces thereof.

The chip is bonded through an Ag paste to a stem, and then an LED lamp is completed by wire bonding and resin sealing. The resultant LED lamp has a relatively low operating voltage of 4.1 V in 20 mA current feeding.

FIG. 12 shows current-output characteristics of Comparative Example 3 (=COMP. EX. 3 in FIG. 12). The output increases substantially linearly up to a high current region as current increases due to the high thermal conductivity of SiC. However, the light extraction efficiency is low since the substrate is thickly colored into green. The output is, as a whole, not so high. The maximum output is about 50 mW.

FIG. 13 shows a time dependency of relative output in 100 mA current feeding of Comparative Example 3 (=COMP. EX. 3 in FIG. 13), provided that output at the start of the current feeding is 100%. The output is kept nearly constant as time passes. This is assumed because heat generated from the active layer can be sufficiently dissipated due to the high thermal conductivity of the SiC substrate.

Comparative Example 4

LED Using a GaN Substrate with a Low Thermal Conductivity

Figure 10:
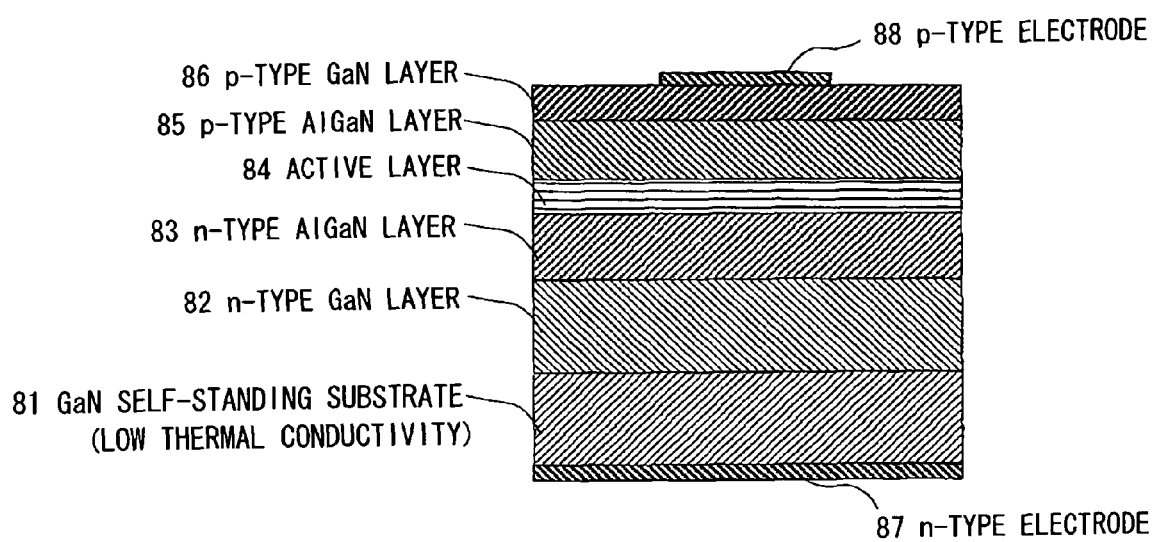
FIG. 10 is a schematic cross sectional view showing an LED structure in Comparative Example 4.

FIG. 10 is a schematic cross sectional view showing an LED structure in Comparative Example 4. The LED in Comparative Example 4 is produced as below.

First, a GaN self-standing substrate is prepared which has properties: a carrier concentration n and an electron mobility μ of $n=5\times10^{18}$ cm$^{-3}$ and $\mu=100$ cm$^2$/Vs, respectively, measured by hole measurement; an electrical resistivity of about 0.01 ohm·cm; a thermal conductivity of 0.8 W/cmK measured by laser flash method; and a dislocation density of $2\times10^7$ cm$^{-2}$ measured by cathode luminescence.

Then, on the GaN self-standing substrate 81 with a diameter of 2 inches, a 4 micrometer-thick n-type GaN layer 82, a 40 nm-thick n-type $Al_{0.1}Ga_{0.9}N$ layer 83, an $In_{0.15}Ga_{0.85}N$/GaN-3-MQW active layer 84 (well layer: 3 nm, barrier layer: 10 nm), a 40 nm p-type $Al_{0.1}Ga_{0.9}N$ layer 85, and a 500 nm-thick p-type GaN layer 86 are sequentially grown epitaxially by MOCVD. This epi-wafer is cut into 300 micrometers square, and a p-type electrode 88 and an n-type electrode 87 are formed on both surfaces thereof.

The chip is bonded through an Ag paste to a stem, and then an LED lamp is completed by wire bonding and resin sealing. The resultant LED lamp has a relatively low operating voltage of 4.1 V in 20 mA current feeding.

FIG. 12 shows current-output characteristics of Comparative Example 4 (=COMP. EX. 4 in FIG. 12). The output increases substantially linearly up to a low current region of about 40 mA as current increases. However, the output is saturated in a high current region, and the maximum output is about 60 mW.

FIG. 13 shows a time dependency of relative output in 100 mA current feeding of Comparative Example 4 (=COMP. EX. 4 in FIG. 13), provided that output at the start of the current feeding is 100%. The output is gradually reduced as time passes. At 500 hours, the output is reduced to about 60% of the initial output. This is assumed because heat generated from the active layer cannot be sufficiently dissipated due to the insufficient thermal conductivity of the substrate though being higher than that of the sapphire substrate. It is assumed that the low thermal conductivity is caused by that the doping amount must be increased to obtain a given electrical property due to the low electron mobility.

Example 4

LED Using a GaN Substrate with a High Thermal Conductivity

Figure 11:
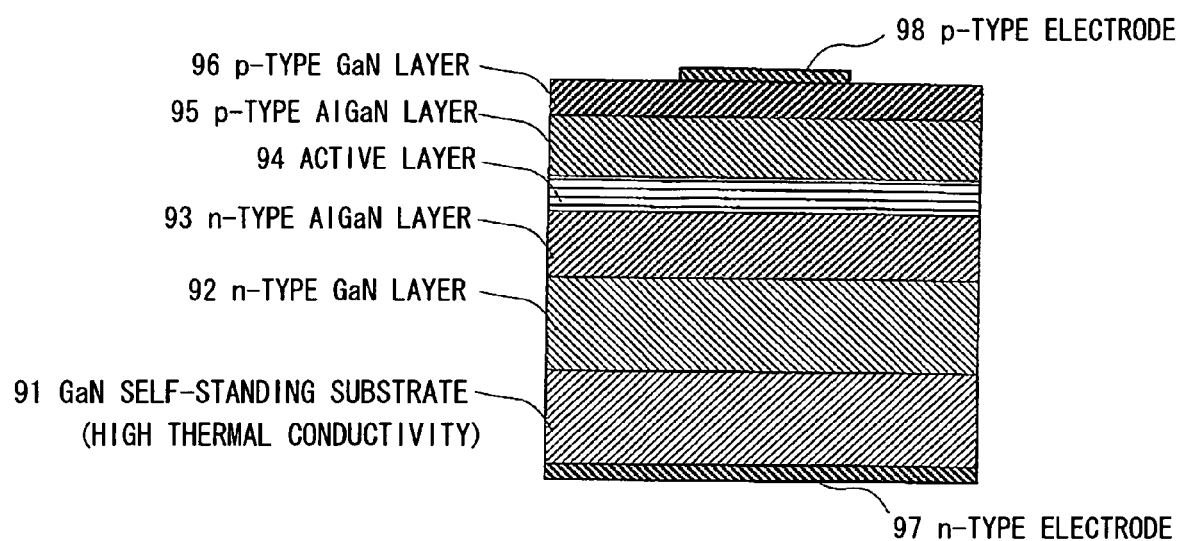
FIG. 11 is a schematic cross sectional view showing an LED structure in Example 4 according to the invention.

FIG. 11 is a schematic cross sectional view showing an LED structure in Example 4. The LED in Example 4 is produced as below.

First, a GaN self-standing substrate is prepared which has properties: a carrier concentration n and an electron mobility μ of $n=2\times10^{18}$ cm$^{-3}$ and $\mu=330$ cm$^2$/Vs, respectively, measured by hole measurement; an electrical resistivity of about 0.01 ohm·cm; a thermal conductivity of 2.0 W/cmK measured by laser flash method; and a dislocation density of $3\times10^6$ cm$^{-2}$ measured by cathode luminescence.

Then, on the GaN self-standing substrate 91 with a diameter of 2 inches, a 4 micrometer-thick n-type GaN layer 92, a 40 nm-thick n-type $Al_{0.1}Ga_{0.9}N$ layer 93, an $In_{0.15}Ga_{0.85}N$/GaN-3-MQW active layer 94 (well layer: 3 nm, barrier layer: 10 nm), a 40 nm p-type $Al_{0.1}Ga_{0.9}N$ layer 95, and a 500 nm-thick p-type GaN layer 96 are sequentially grown epitaxially by MOCVD. This epi-wafer is cut into 300 micrometers square, and a p-type electrode 98 and an n-type electrode 97 are formed on both surfaces thereof.

The chip is bonded through an Ag paste to a stem, and then an LED lamp is completed by wire bonding and resin sealing. The resultant LED lamp has a relatively low operating voltage of 4.0 V in 20 mA current feeding.

FIG. 12 shows current-output characteristics of Example 4. The output increases substantially linearly up to a current region of about 60 mA as current increases. Although the output is a little saturated in a higher current region, and the maximum output is highest, about 95 mW.

FIG. 13 shows a time dependency of relative output in 100 mA current feeding of Example 4, provided that output at the start of the current feeding is 100%.

Significant reduction in output is little measured during this test period. This is assumed because heat generated from the active layer can be sufficiently dissipated since the thermal conductivity of the substrate is sufficient to dissipate heat from the LED although being lower than that of SiC, and because the internal quantum efficiency is high due to the low dislocation density and the light extraction efficiency is high due to the refractive index matching to the epi-layer. Further, it is assumed that the high thermal conductivity is caused by that the doping amount is not needed to be increased much to obtain a given electrical property due to the high electron mobility.

Example 5

Relationship Between Carrier Concentration and Electron Mobility

GaN substrates are produced in the same manner as Example 2 to have carrier concentrations of $2\times10^{18}$, $4\times10^{18}$, $6\times10^{18}$, and $1.2\times10^{19}$ cm$^3$. The electron mobility µ is measured by hole measurement.

FIG. 14 is a graph showing a relationship between a carrier concentration and an electron mobility in Example 5. For comparison, also shown therein are data as taught in Document 2 (S. Nakamura et al., "Si- and Ge-doped GaN Films Grown with GaN Buffer layers", Jpn. J. Appl. Phys. Vol. 31 (1992) pp. 2883-2888) and Document 3 (R. Y. Korotkov et al., "ELECTRICAL PROPERTIES OF OXYGEN DOPED GaN GROWN BY METALORGANIC VAPOR PHASE EPITAXY", MRS Internet J. Nitride Semicond. Res. 5S1, W3.80 (2000)).

As shown in FIG. 14, the electron mobility in Example 5 falls within a region (shaded region) surrounded between Formula A ($\log_e \mu=17.7-0.288 \log_e n$) and Formula B ($\log_e \mu=18.5-0.288 \log_e n$), where the carrier concentration thereof is in the range of $1.2\times10^{18}$ cm$^{-3}$ or more and $3\times10^{19}$ cm$^{-3}$ or less. It is proved that the electron mobility in Example 5 is higher than that in Documents 2 and 3.

Other Applications and Modifications

Although in the above embodiments the invention is applied to the LED, the invention can be also applied to a high-output device such as LD and power conversion device other than the LED, whereby the same effects can be obtained.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A nitride-based semiconductor substrate, comprising:
    a substrate comprising a nitride-based semiconductor, wherein the substrate comprises:
        a diameter of 25 mm or more;
        a thickness of 250 micrometers or more;
        a dislocation density of $1\times10^7$ cm$^{-2}$ or less;
        an oxygen impurity concentration of $10^{16}$ cm$^{-3}$ or less;
        an n-type carrier concentration in a range of $1.2\times10^{18}$ cm$^{-3}$ to $3\times10^{19}$ cm$^{-3}$; and
        a thermal conductivity in a range of 1.2 W/cmK to 3.5 W/cmK.

2. The nitride-based semiconductor substrate according to claim 1, wherein:
    the substrate comprises an electrical resistivity of 0.001 ohm·cm or more and 0.02 ohm·cm or less.

3. The nitride-based semiconductor substrate according to claim 1, wherein the substrate comprises a concentration of As, Cl, P, Na, K, Li, Ca, Sn, Ti, Fe, Cr and Ni to be all $1\times10^{17}$ cm$^{-3}$ or less.

4. A semiconductor device, comprising:
    the nitride-based semiconductor substrate as defined in claim 1; and
    a nitride-based semiconductor layer grown epitaxially on the nitride-based semiconductor substrate.

* * * * *